United States Patent
Roy et al.

(10) Patent No.: US 12,224,024 B2
(45) Date of Patent: Feb. 11, 2025

(54) MEMORY WITH ONE-TIME PROGRAMMABLE (OTP) CELLS

(71) Applicant: NXP USA, Inc., Austin, TX (US)

(72) Inventors: Anirban Roy, Austin, TX (US); Nihaar N. Mahatme, Austin, TX (US); Jon Scott Choy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 138 days.

(21) Appl. No.: 18/188,804

(22) Filed: Mar. 23, 2023

(65) Prior Publication Data

US 2024/0321372 A1 Sep. 26, 2024

(51) Int. Cl.
G11C 17/02 (2006.01)
G11C 17/16 (2006.01)
G11C 17/18 (2006.01)
H10B 20/25 (2023.01)

(52) U.S. Cl.
CPC ............ *G11C 17/18* (2013.01); *G11C 17/02* (2013.01); *G11C 17/16* (2013.01); *H10B 20/25* (2023.02)

(58) Field of Classification Search
CPC ......... G11C 17/18; G11C 17/02; G11C 17/16; G11C 7/16; G11C 11/1697; G11C 11/1677; G11C 7/1078; G11C 11/161; G11C 11/1675; H10B 20/25
See application file for complete search history.

(56) References Cited

U.S. PATENT DOCUMENTS

| | | | |
|---|---|---|---|
| 4,943,948 A | 7/1990 | Morton et al. | |
| 7,180,764 B2 | 2/2007 | Kim et al. | |
| 7,385,857 B2 | 6/2008 | Dalton | |
| 7,843,747 B2 | 11/2010 | Hsueh et al. | |
| 7,952,917 B2 | 5/2011 | Xi et al. | |
| 8,549,363 B2 | 10/2013 | Cher et al. | |
| 9,754,678 B2 | 9/2017 | Byun et al. | |
| 10,699,764 B1 | 6/2020 | Roy et al. | |
| 10,861,524 B1 * | 12/2020 | Roy | G11C 11/1693 |
| 11,049,539 B1 * | 6/2021 | Sanjeevarao | G11C 11/1655 |
| 11,521,692 B2 | 12/2022 | Choy et al. | |
| 2005/0248991 A1 | 11/2005 | Lee et al. | |

(Continued)

FOREIGN PATENT DOCUMENTS

| | | | | |
|---|---|---|---|---|
| CN | 105427888 A | | 3/2016 | |
| EP | 3667668 A1 * | | 6/2020 | G11C 11/005 |

*Primary Examiner* — Jay W. Radke
(74) *Attorney, Agent, or Firm* — Joanna G. Geld (57) ABSTRACT

A magnetoresistive random access memory (MRAM) array includes MRAM cells, each MRAM cell having a corresponding Magnetic Tunnel Junction (MTJ) capable of being in a blown state or non-blown state, in which the blown state corresponds to a permanent breakdown of a tunnel dielectric layer of the corresponding MTJ. Write circuitry performs a one-time-programmable (OTP) write operation to blow selected MRAM cells. For each MRAM cell being blown, the write circuitry uses an initial OTP program reference for the MRAM cell being blown to detect onset of tunnel dielectric breakdown after application of each OTP write pulse of the OTP write operation. After detection of the onset, the write circuitry updates the initial OTP program reference, applies at least one additional OTP write pulse to the MRAM cell being blown, and uses the updated OTP program reference to verify that current saturation of the MRAM cell being blown has occurred.

20 Claims, 5 Drawing Sheets

(56) References Cited

U.S. PATENT DOCUMENTS

| | | | | |
|---|---|---|---|---|
| 2014/0063895 A1* | 3/2014 | Li | ............................ | G11C 17/16 |
| | | | | 365/97 |
| 2014/0215294 A1* | 7/2014 | Kim | ...................... | G11C 17/146 |
| | | | | 714/819 |
| 2015/0103586 A1* | 4/2015 | Kim | ...................... | G11C 17/165 |
| | | | | 365/158 |
| 2019/0348986 A1* | 11/2019 | Kay | .................. | H03K 19/17764 |
| 2020/0194048 A1* | 6/2020 | Roy | ........................ | H10B 61/20 |
| 2020/0303386 A1* | 9/2020 | Kothandaraman | .... | H10N 50/01 |
| 2020/0303452 A1* | 9/2020 | Houssameddine | .... | H10N 50/01 |
| 2021/0159902 A1* | 5/2021 | Lukefahr | ............ | H03K 19/1776 |
| 2022/0301647 A1* | 9/2022 | Choy | ........................ | G11C 17/16 |
| 2022/0358982 A1* | 11/2022 | Williams | ................ | G11C 17/18 |

\* cited by examiner

MEMORY WITH ONE-TIME PROGRAMMABLE (OTP) CELLS

BACKGROUND OF THE INVENTION

Field of the Invention

This invention relates in general to a memory and more specifically to a memory with one time programmable (OTP) cells.

Background

In general, a magneto-resistive random access memory (MRAM) one time programmable (OTP) cell can be created based on creating an antifuse of the magnetic tunnel junction (MTJ) element in the memory cell. This can be achieved by providing a sufficient current through the MTJ to result in a dielectric breakdown of the tunnel dielectric of the MTJ. This results in a blown memory cell which has a low resistance/high current path through the MTJ, as compared to an MTJ which has not experienced a dielectric break down (i.e. a non-blown memory cell). In order to operate as an OTP, though, the dielectric breakdown of the tunnel dielectric should be permanent to maintain its blown state. A hard breakdown tunnel dielectric permanently and reliably maintains its blown state, while a soft breakdown tunnel dielectric may lead to long term reliability issues due to breaking of the high current path which was created with the dielectric breakdown. Therefore, there is a need for improved programming of an OTP memory cell which ensures that the OTP cell is formed with a hard breakdown of the dielectric rather than a soft breakdown in order to achieve improved reliability.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an MRAM includes an array of MRAM cells that can be utilized as one-time programmable (OTP) cells. An MRAM is arranged in rows (along word lines) and columns (along bit line/source line pairs), in which the intersection of each row (word line) and column (bit line/source line pair) has a corresponding MRAM cell (i.e. memory cell) having a select transistor and a magnetic tunnel junction (MTJ). In one embodiment, all the cells of a memory are configured as OTP devices. In some embodiments, the memory may include both OTP cells as well as reprogrammable memory cells (in which reprogrammable memory cells can be written multiple times over the life of the memory). The MTJs of the cells which are used as OTP devices may be "blown" during an OTP write in order to provide a permanent conductive state which is determinable from the conductive state of an unblown cell (i.e. non-blown cell). In this manner, permanent values can be stored in the memory which can later be read. Any OTP cell which is not blown during an OTP write can either be in a high resistive state (HRS) or a low resistive state (LRS). The blown state of an MRAM cell has a relatively low resistance value as compared to the non-blown state, regardless of whether the non-blown cell is in the HRS or the LRS. For an OTP read, a blown state of an MRAM cell may correspond to a permanently stored "0" logic state (while a non-blown state may correspond to a stored "1" logic state, regardless of whether the non-blown state is the HRS or the LRS). Non-blown OTP cells can be reprogrammed with non-OTP writes, as desired, between the HRS and the LRS, in which the HRS and the LRS correspond to non-OTP stored logic states (e.g. a "1" and a "0", respectively).

The MTJ of an OTP cell can be blown, during an OTP write operation, by providing a sufficient current through the MTJ to result in a dielectric breakdown of the tunnel dielectric of the MTJ. Ideally, the dielectric breakdown of the dielectric should be permanent to maintain its blown state in order to reliably operate as an OTP. As described above, though, a hard breakdown tunnel dielectric permanently and reliably maintains its blown state, while a soft breakdown tunnel dielectric may not reliably maintain its blown state due to breaking of the high current path which was created with the dielectric breakdown. Those OTP cells which result in a soft breakdown tunnel dielectric lead to long term reliability issues. Therefore, in one embodiment, an OTP cell is programmed in such a way as to ensure that the OTP is formed with a hard breakdown of the tunnel dielectric. In one embodiment, a self-referencing scheme ensures first that breakdown of the dielectric has begun and that subsequently, a hard breakdown is reached.

Figure 1:
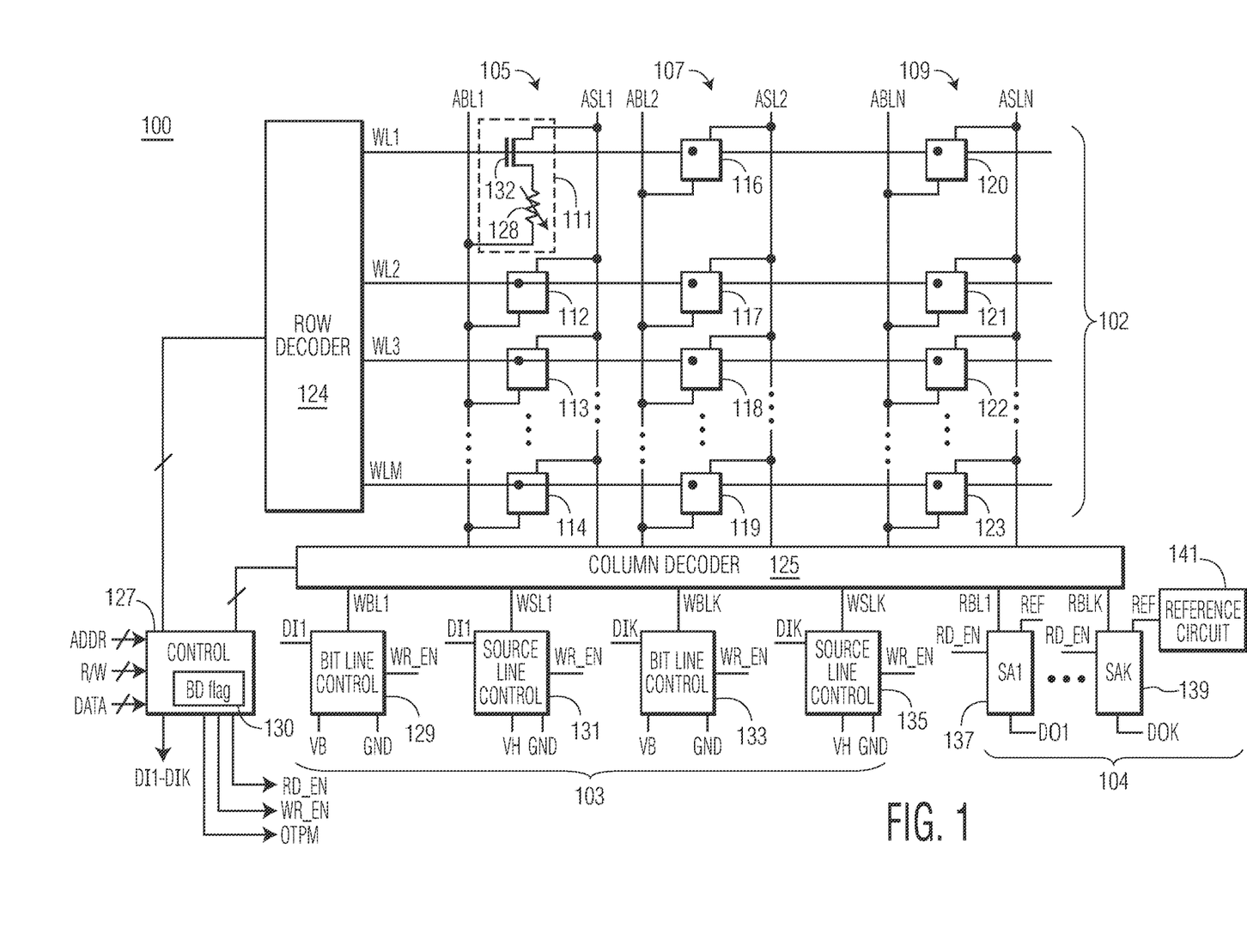
FIG. 1. is a diagram of an MRAM according to one embodiment of the present invention.

FIG. 1 is a diagram of an MRAM according to one embodiment of the present invention. MRAM 100 (also referred to as memory 100) includes an array 102 of MRAM cells (111-123) located in M rows and N columns (105, 107, 109) for storing data, in which each of M and N can be any positive integer greater than one. Each MRAM cell stores one bit of data, and may therefore also be referred to as a bit cell of the memory. In the illustrated embodiments herein, it is assumed that all cells of array 102 are configured as OTP cells (i.e. OTP devices), therefore memory 100 may be referred to as an OTP memory. However, in an alternate embodiment, array 102 may be a portion of a larger memory array which also includes reprogrammable (i.e. non-OTP) MRAM cells. In this alternate embodiment, note that more circuitry may be needed in memory 100 than those elements illustrated in FIG. 1. MRAM 100 also includes a control circuit 127 which receives read and write access requests for MRAM 100. Each access request includes a corresponding access address (ADDR) which identifies (i.e. addresses) a selected set of MRAM cells for the access request, a corresponding read/write indicator (R/W) which indicates whether the access request is a read or a write request, and corresponding write data (DATA) if the access request is a write request.

Control circuit 127 outputs a read enable signal RD_EN and a write enable signal WR_EN. In the illustrated embodiment, control circuit 127 also outputs an OTP mode signal OTPM, which controls whether reads or writes are being performed in OTP mode (i.e. an OTP write or an OTP read) or in MRAM mode (i.e. an MRAM write or an MRAM read). Note that an MRAM write or MRAM read may also be referred to as a non-OTP write or non-OTP read, respectively, or as a normal write or normal read, respectively. Control circuit 127 also includes storage circuitry 130 configured to store a control flag, breakdown (BD) flag, and may store additional values, as needed, for performing read and write operations.

Still referring to FIG. 1, column 105 includes cells 111-114, column 107 includes cells 116-119, and column 109 includes cells 120-123. In one embodiment, each cell (111) is characterized as an MRAM cell that includes a magnetic tunnel junction (MTJ) (128 for cell 111) and a select transistor (132 for cell 111) whose control terminal is coupled to a word line (WL1 for cell 111) that is asserted to access a specific row of memory cells for either reads or writes to the cells. The word lines (WL1-WLM) are provided by an address row decoder 124 and are selectively activated (i.e. asserted) based on the memory address of an access request received by control 127 from processing circuitry (not shown).

Each MRAM cell of a column is connected to a corresponding array bit line of the column (one of ABL1-ABLN) and a corresponding array source line of the column (a corresponding one of ASL1-ASLN). In the illustrated embodiment, the MRAM cell is connected to the array source line at the source of the select transistor. For example, MRAM cell 111 is connected to ABL1 of column 105, and the corresponding ASL1 of column 105, in which ASL1 is connected at the source of select transistor 132. Although FIG. 1 shows that array 102 includes four rows (corresponding to word lines WL1-WLM) and three columns (105, 107, and 109), other embodiments may include a different number of rows (M) and/or a different number of columns (N).

In some embodiments, the MTJs of the cells 111-123 of MRAM array 102 have the same structure. As used herein, MTJs having the same structure mean that the corresponding structures of the MTJs have the same physical dimensions and are made of the same materials within manufacturing tolerances. Note that although a one-transistor one-resistor (1T1R or 1T1MTJ) is illustrated in FIG. 1, the cells can have a different configuration, such as a one-transistor two-resistor (1T2R) configuration. As used herein with respect to information stored in a memory, the term "data" also includes instructions or commands stored in a memory.

Memory 100 includes read circuitry 104 for reading data stored in the cells of array 102. In the embodiment shown, read circuitry 104 includes sense amplifiers (SAs) 137 and 139, each for sensing the data value stored in a memory cell by comparing the resistance of the memory cell to a reference resistance. During a read operation, a sense amplifier (e.g. SA1 137) is coupled to a corresponding bit line (e.g. ABL1) of a selected column (e.g. 105) by column decoder 125 to compare a resistance of a selected cell (e.g. 111) of that column to the reference resistance. For example, a sense amplifier can compare a sensed cell current to a reference current. (Alternatively, the sense amplifiers can each be coupled to a corresponding source line instead of a corresponding bit line.) Each sense amplifier also receives a read enable signal (RD_EN) from control circuit 127 which is asserted to enable the sensing of the data values stored in a selected set of MRAM cells indicated by a received read access address. The sense amplifiers SA1-SAK output the read data (DO1-DOK) to processing circuitry (not shown) on a data bus (not shown). A reference signal, REF, indicative of the reference resistance is provided to the sense amplifiers by a reference circuit 141. For example, REF may be a reference current (Iref) which is based on a reference voltage (Vref). The references may differ based on whether an OTP read or write is being performed versus a normal (non-OTP) read or write is being performed. In one embodiment, reference circuit 141 provides the appropriate reference signal, REF, based on the state of the OTPM bit which indicates whether the current memory operation is an OTP operation or normal (non-OTP) operation.

Memory 100 includes write circuitry 103 for writing data to memory cells of array 102. In the embodiment shown, write circuitry 103 includes bit line control circuits (e.g. 129 and 133) for controlling the voltage of the array bit lines (ABL1, ABLN) of selected columns during a memory write operation to selected MRAM cells of the array. The write circuitry also includes source line control circuits (e.g. 131 and 135) for controlling the voltage of the array source lines (ASL1, ASLN) of selected columns during a memory write operation to the selected MRAM cells.

During reads and writes, control circuit 127 provides a first portion of ADDR to row decoder 124 and a second portion of ADDR to column decoder 125. During a memory access operation (read or write), row decoder 124 activates a selected word line based on the received first portion of ADDR. Row decoder 124 may activate the selected word line by setting the selected word line to a voltage that is greater than ground.

During a memory access operation (including OTP and non-OTP operations), column decoder 125 couples a selected subset of K columns of array 102, based on the second portion of ADDR, to read circuitry 104 or write circuitry 103. For example, during a memory write operation, column decoder 125 couples the K array bits lines of the K selected columns to the corresponding bit line control circuits (e.g. 129 and 133) via write bit lines (WBL1-WBLK) and the corresponding K array source lines of the K selected columns to the corresponding source line control circuits (e.g. 131 and 135) via write source lines (WSL1-WSLK). During a memory read operation, column decoder 125 couples the K array bit lines of the K selected columns to sense amplifiers SA1—SAK via read bit lines (RBL1-RBLK). In an alternate embodiment, the source lines of the K selected columns, instead of the bit lines, may be coupled to the sense amplifiers via read source lines. Therefore, note that the bit lines and the source lines of MRAM 100 may both be referred to as column lines of MRAM 100. During the memory read operation, as will be discussed further below, column decoder 125 also couples the K array bit lines of the K selected columns to the corresponding bit line control circuits, and the K array source lines of the K selected columns to the corresponding source line control circuits.

In one embodiment, the decode ratio (N/K) of decoder 125 is 8 to 1, where N is the number of columns in array 102 and K is the number of sense amplifiers/line control circuit pairs. However, this ratio may be of other values in other embodiments (e.g. 1, 4, 16). In one embodiment, K is 64 and N is 512, but these may be of different values in other embodiments. Some embodiments do not include a column decoder where each column includes its own sense amplifier and bit line control circuit/source line control circuit pair.

In one embodiment, MRAM 100 is located on the same integrated circuit (IC) as the processing circuitry (not shown) that requests the memory accesses. In other embodiments, MRAM 100 may be located on a separate integrated circuit. In still other embodiments, MRAM 100 may have other configurations. Also, in one embodiment, any OTP memory cells can be located outside of an array configuration, and, although area inefficient, may even be scattered around the IC.

The cells of array 102 can be utilized as reprogrammable MRAM cells where a data state can be changed multiple times over the life of array 102 or OTP cells where a data state can be permanently programmed in the cell. In the illustrated embodiment, all cells of array 102 are utilized as OTP cells, but the structure of the MTJs in an OTP cell is the same as they would be in a reprogrammable MRAM cell.

Figure 2:
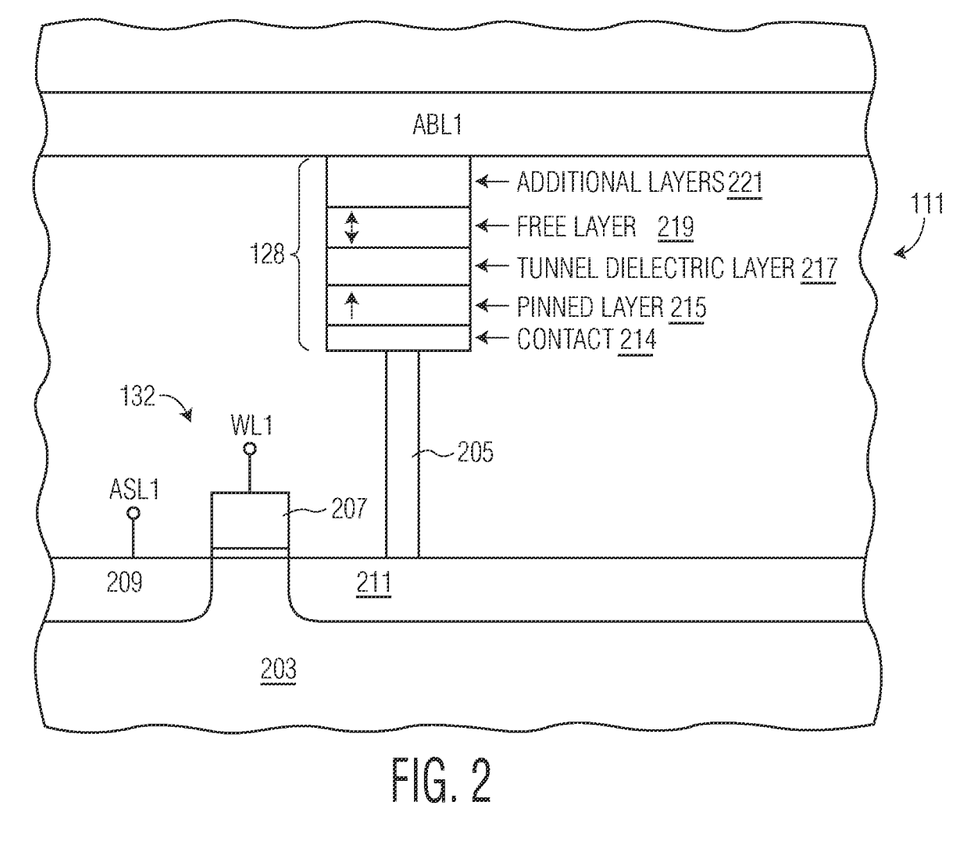
FIG. 2 is a side view of a MRAM cell of FIG. 1 according to one embodiment of the present invention.

FIG. 2 is a side view of an MRAM cell, which can represent any of the OTP cells of array 102 of FIG. 1, according to one embodiment of the present invention. In the embodiment shown, an access transistor 132 of cell 111 is a complementary metal-oxide-semiconductor (CMOS) transistor with a source region 209 and drain region 211 located in a semiconductor substrate 203 of an integrated circuit. Source region 209 is connected to array source line ASL1. Drain region 211 is connected to MTJ 128 by via 205 which is located in one or more interconnect layers of the integrated circuit of the MRAM. The gate 207 of transistor 132 is connected to a word line WL1.

In the embodiment shown, MTJ 128 includes a conductive contact layer 214, a pinned magnetic layer 215, a tunnel dielectric layer 217, and a free magnetic layer 219. In the embodiment shown, MTJ 128 also includes additional layers 221 that include conductive layers. In one embodiment, pinned magnetic layer 215 and free magnetic layer 219 are made of ferromagnetic materials such as cobalt iron boron (CoFeB) and tunnel dielectric layer is made of a dielectric material such as magnesium oxide (MgO). However, these layers may be made of other materials in other embodiments. Also, in other embodiments, an MRAM cell may have other configurations.

The magnetization direction of the pinned layer 215 is fixed. The magnetization direction of free layer 219 can be programmed to be in a parallel (p) direction or an anti-parallel (ap) direction to the magnetization direction of pinned layer 215 in order to place the cell 111 into the LRS or the HRS, respectively. When the magnetization direction of free layer 219 is in an anti-parallel direction, the resistance of the MTJ is at a relatively high value, corresponding to the HRS. When the magnetization direction of free layer 219 is in a parallel direction, the resistance of the MTJ is of a relatively lower value, corresponding to the LRS. If cell 111 were utilized as a reprogrammable MRAM cell, the HRS corresponds to storing "1" in the memory cell, and the LRS to storing "0." A sense amplifier coupled to both the array bit line of the cell and to a reference resistance that is in between the high resistive value and the low resistive value can determine, during a normal (non-OTP) read of the reprogrammable cell, whether a one "1" value (e.g. HRS) or a zero "0" value (e.g. LRS) is stored in the MTJ. Alternatively, the HRS may instead correspond to a zero value and the LRS to a one value, however, for the embodiments discussed herein, it is assume that the HRS corresponds to the one value.

During a normal (non-OTP) write operation to a reprogrammable MRAM cell, the magnetization direction of free layer 219 can be set by applying a voltage differential of sufficient magnitude across the MTJ to generate the desired current density for setting the magnetization direction of free layer 219. In one embodiment, the magnetization direction of free layer 219 can be set in one direction by applying a higher voltage (VH) to the array bit line (ABL1) and a lower voltage (Gnd) to the source line (ASL1) while the select transistor is conductive, and can similarly be set in the other direction by applying the lower voltage (Gnd) to the array bit line and the higher voltage (VH) to the array source line while the select transistor is conductive. That is, current in a first direction through the MTJ programs the MTJ to a first logic state, and current in a second direction, opposite the first direction, programs the MTJ to a second logic state. In this manner, a reprogrammable MRAM cell can be programmed any number of times to the HRS (i.e. Rap) or LRS (i.e. Rp), to store a "1" or a "0."

While a reprogrammable MRAM cell can be in the HRS or the LRS, an OTP MRAM cell (or the MTJ within the OTP MRAM cell) can either be in a permanently blown state or in a non-blown state. Assuming cell 111 is an OTP cell, during an OTP write operation, a sufficiently higher voltage differential than during a normal (non-OTP) write operation can be applied between the array bit line and array source line when select transistor 132 is conductive to permanently break down the resistance of tunnel dielectric layer 217. In this manner, MTJ 128 results in having a relatively low resistance value Rotp (and thus result in a relatively high cell current) as compared to the resistance value of a non-blown cell (whether in the HRS or the LRS) where the tunnel dielectric layer is not broken down. As used herein, a cell whose tunnel dielectric has been permanently broken down is referred to as a blown cell and is thus permanently shorted (in a permanently blown state). In one embodiment, a blown cell corresponds to permanently storing an OTP value of zero (0). In one embodiment, a non-blown cell (i.e. a cell being in the non-blown state), regardless of whether it is in a HRS or a LRS, corresponds to storing an OTP value of one (1). Once a cell has been blown, it cannot be programmed to provide the HRS or the LRS value regardless of the magnetization direction of free layer 219. Therefore, any write operation to a blown OTP cell does not change the stored value of the cell.

Figure 3:
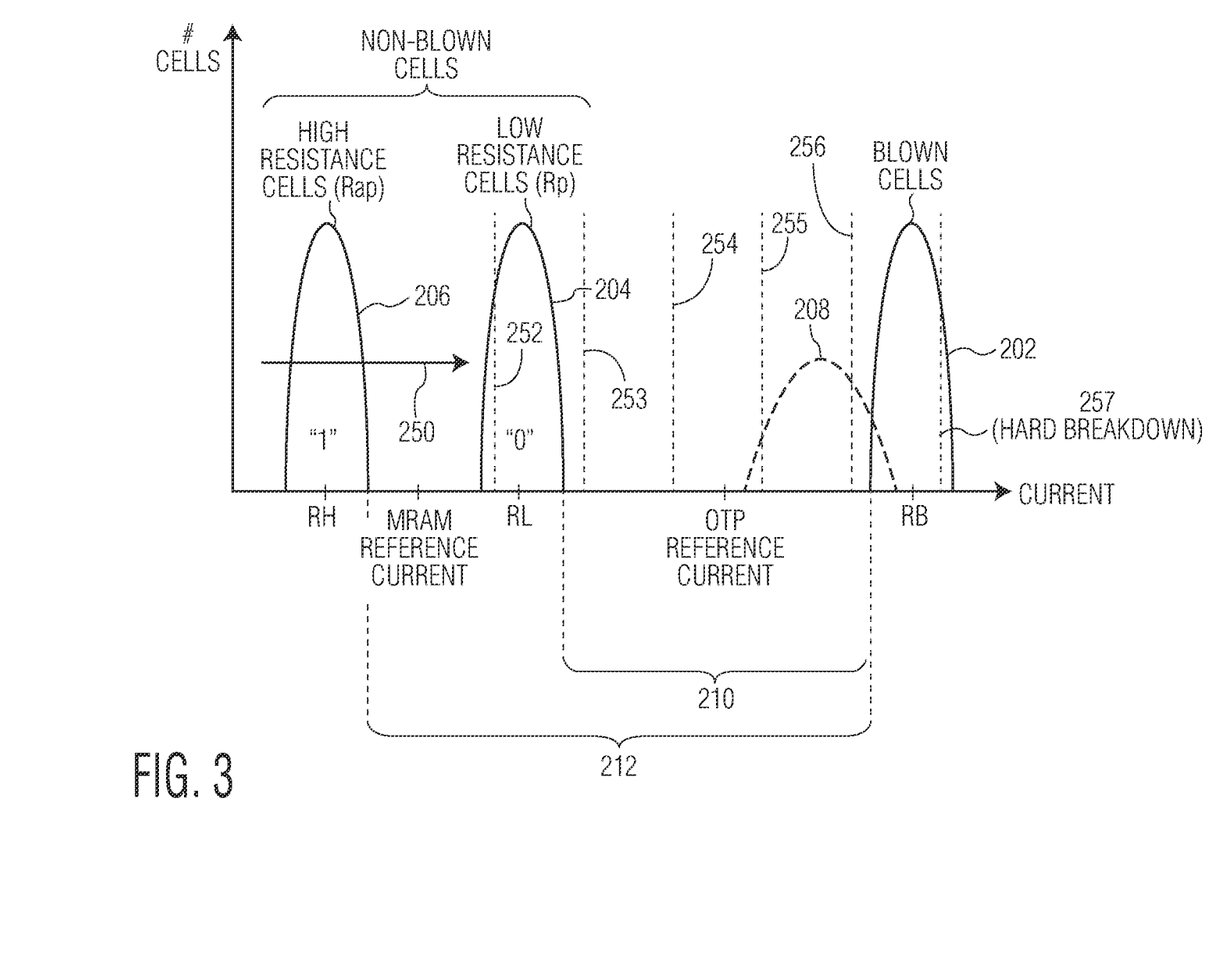
FIG. 3 is a graph showing a distribution of resistances of cells of an MRAM array according to one embodiment of the present invention.

FIG. 3 illustrates a graph showing a distribution of resistances of cells of a memory array according to one embodiment of the present invention. The resulting cell current values are on the X axis (which varies linearly with resistance, such that the cell current increases as the cell resistance decreases) and the number of cells having a particular resistance is on the Y axis. FIG. 3 show the resistance distribution for cells of an array that are blown and those that are not blown. The cells that are not blown are either in the HRS (Rap) or LRS (Rp).

In the embodiment shown, the blown cells have a resistance distribution 202 centered on the resistive value RB. The low resistance state cells have a resistance distribution 204 centered on RL, and the high resistance state cells have a resistance distribution 206 centered on resistance RH. The OTP reference resistance can be centered half way between RB and RL to distinguish between a blown and non-blown cell for an OTP read. The MRAM reference resistance can be centered half way between RL and RH to distinguish between the HRS and LRS states of a non-blown cell for a non-OTP read. During a read operation, a cell current of the MRAM cell is highest for blown cells, and lower for the non-blown cells (in which the cell current for a non-blown cell is higher for a cell in the LRS than the HRS).

Therefore, in the case of normal (non-PTO) read operations, sense amplifiers can determine whether the resistance of a selected (i.e. addressed) cell is higher or lower than the MRAM reference resistance. This can be done by comparing a read current (Icell) provided from the selected cell being read to a non-OTP reference current provided by a reference cell having the MRAM reference resistance, in which cells for which Icell is less than the non-OTP reference current, the sense amplifier outputs a read data value of "1" and when Icell is greater than the non-OTP reference current, the sense amplifier outputs a read data value of "0". However, in the case of OTP read operations, sense amplifiers can instead determine whether the resistance of a selected (i.e. addressed) cell is higher or lower than the OTP reference resistance. This can be done by comparing the read current (Icell) from the cell being read to an OTP reference current (Iref) provided by a reference cell having the OTP reference resistance, in which cells for which Icelll is greater than the OTP reference current, the sense amplifier outputs an OTP read data value of "0," and when Icell is less than the OTP reference current, the sense amplifier outputs an OTP read data value of "1."

In the case of either MRAM or OTP write operations, each write operation may include the application of multiple write pulses, in which each subsequent pulse for a write may be the same as the previous pulse or may be stronger (e.g. longer in time, greater in current or voltage). Each write pulse produces a write current (i.e. programming current) through the MTJ. Note that the OTP write "0" (to Rotp) and the MRAM write "0" (to Rp) are similar, in that both create a write current in the same direction through the MTJ, however, the OTP write is stronger (e.g. produces a greater write current) than the MRAM write "0". After the application of each write pulse, a verify read is performed to determine whether the MTJ has achieved the desired resistance state. The verify reads are performed in the same manner as the read operations described above. For example, in the case of an OTP write "0", after each write pulse, a verify read can be performed to determine whether the cell current is greater than the OTP reference current. If not, a subsequent write pulse can be applied followed by a verify read. This repeats until the cell is sufficiently programmed (until the cell current is verified to be greater than the OTP reference current). Note that the OTP reference current used during the verify read may be referred to as the OTP program reference and may be the same or different than that OTP read reference used during OTP read operations which are not verify reads.

Still referring to FIG. 3, as was described above, a blown cell may be in a hard breakdown state or a soft breakdown state, in which the soft breakdown state usually provides reduced reliability as compared to the hard breakdown state. As resistance decreases from the HRS cells in distribution 206 to the LRS cells in distribution 204 to the lowest resistance blown cells of distribution 202, the resulting read current increases from distribution 206 to distribution 204 to the highest read current for distribution 202. When a voltage sufficient to cause breakdown of the tunnel dielectric is applied to the MTJ, the MTJ can transition from the HRS or the LRS to the blown state in which if the tunnel dielectric of the MTJ is at the onset of breakdown or just past the onset of breakdown, the resulting blown MTJ may only be in the soft breakdown state. This may result in a distribution 208 of blown cells which are actually only in the soft breakdown state. Distribution 208 results in a reliability risk in which these blown cells may lose state after a thermal, magnetic, or other excursion or tamper events. If additional programming is applied, though, moving the MTJ further past the onset of breakdown, the blown cells in resulting distribution 202 are ensured to be in the hard breakdown state. Therefore, in one embodiment, an OTP write operation is performed which ensures that any blown OTP is not only blown but blown into the hard breakdown state such that the resulting distribution of blown cells includes distribution 202 of blown cells in the hard breakdown state and includes little to no blown cells in the soft breakdown state such that distribution 208 is prevented from occurring.

For improved reliability, it is desirable to set the MRAM and OTP references to provide optimal read margins. For a non-OTP MRAM memory, the MRAM array can be mapped during wafer testing in order to select an MRAM reference that is in the middle of the gap between the HRS and LRS distributions to provide an optimal margin for a normal MRAM read. However, the OTP distribution of an MRAM array is not known until the OTP bits are blown, so a priori to blowing any OTP bits, there is no knowledge of the minimum current of the distribution of blown cells (distribution 202). Therefore, there is uncertainty in selecting the OTP reference that will guarantee that, upon programming an OTP cell, the OTP cell is fully blown into the hard breakdown state. If the hard breakdown state is not achieved, then the OTP read window (between distributions 204 and 202), is not optimal, and may cause mis-reads or lost states.

Therefore, in one embodiment, due to the uncertainty in selecting an appropriate OTP program reference, a global OTP program reference is not used. Instead, the OTP resistance state evolution during each OTP write operation is monitored to determine when it has reached the hard breakdown state. In one embodiment, a self-referencing OTP write operation first determines the data "0" state (the Rp state or LRS) and ensures that the breakdown ensues after OTP write pulse application and then that current saturation occurs after hard breakdown. That is, due to the very low resistance of the blown MTJ after hard breakdown, the cell current is limited by array parasitics. For example, in one embodiment, the self referencing OTP write operation includes two phases of operation. A first phase of the OTP write operation ensures that breakdown of the MTJ is achieved (i.e. corresponding to the onset of breakdown), in which the tunnel dielectric of the MTJ at the end of the first phase can either be in the soft or hard breakdown state. A second phase of the OTP write operation, subsequent to the first phase, ensures that the cells whose MTJ is in the soft breakdown state are provided additional programming (e.g. one or more additional OTP write pulses) to achieve hard breakdown.

Figure 4:
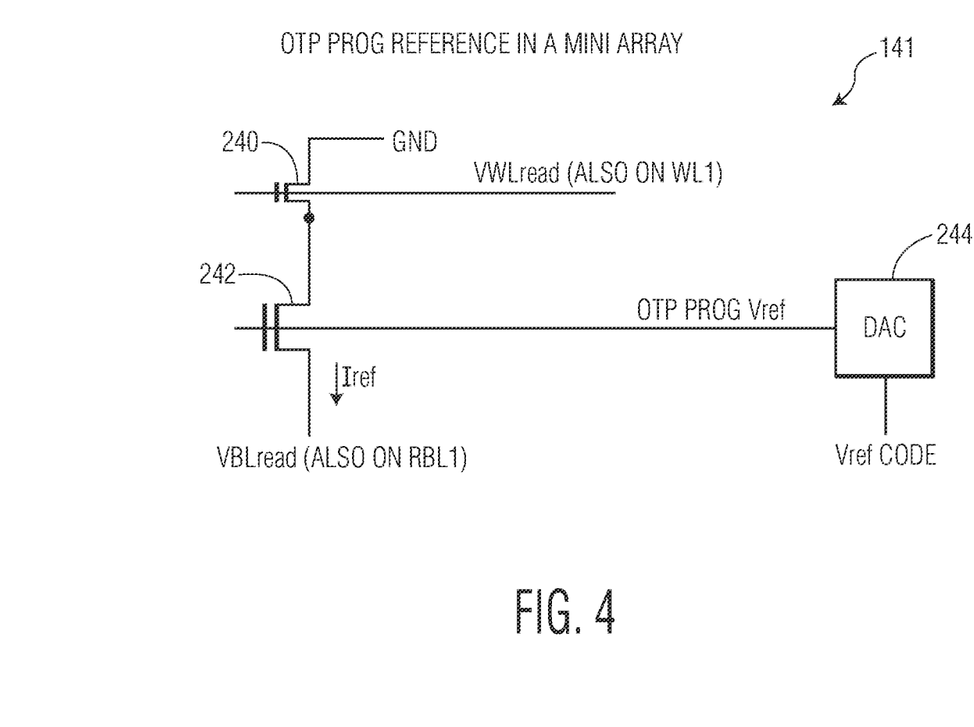
FIG. 4 is a schematic diagram of a reference circuit of the MRAM of FIG. 1, according to one embodiment of the present invention.

FIG. 4 illustrates, in schematic form, a portion of reference circuit 141, in accordance with one embodiment of the present invention. Reference circuit 141 includes a first NMOS transistor 240, which is intended to be similar to the select transistors of the memory cells (i.e. bit cells) of array 102, coupled in series with a second NMOS transistor 242, which operates as a variable resistor. A first current electrode of transistor 240 is analogous to the source line of a memory cell and is coupled to receive a source line voltage, a second current electrode of transistor 240 is coupled to a first current electrode of transistor 242, and a second current electrode of transistor 242 is analogous to the bit line of the memory cell and is coupled to receive a bit line voltage. Therefore, the structure of the illustrated reference portion 141 is intended to replicate a memory cell of array 102 in order to generate an OTP reference current, Iref, based on an OTP reference voltage, OTP prog Vref. The OTP reference current Iref is provided to each sense amplifier, which compares Iref to the read current (Icell) provided by the bit line of the selected memory cell being read during a read operation (a normal read or a verify read).

In one embodiment, reference circuit portion 141 also includes a digital to analog converter (DAC) 244 which is coupled to receive a Vref code and is coupled to provide OTP prog ref to a control electrode of transistor 242. In one embodiment, DAC 244 is a 5-bit DAC and therefore the Vref code is a 5-bit digital code. By varying OTP prog ref (e.g. by varying the Vref code), the resistance of the variable resistor implemented by transistor 242 is also varied. For example, in one embodiment, OTP prog Vref can vary from an initial voltage (Vint) to a final voltage (Vfin) over a range of values of the Vref code, in which, the resulting Iref varies from a corresponding initial current (Iint) to a corresponding final current (Ifin). Therefore, each value of Vin to Vfin corresponds to a corresponding value of Iint to Ifin, and the value of Iref can be controlled by controlling the value of the Vref code. For example, for DAC 244 to output OTP prog Vref as Vint (its minimum value in the range of Vint to Vfin), the value of the Vref code can be set to its minimum value. This results in providing Iref at its minimum value Iint in the range of Iint to Ifin. As the Vref code is increased in value, Vint increases towards Vfin, and likewise, Iint increases towards Ifin. (Note that Vref code can be provided by control circuit 127. In an alternate embodiment, DAC 244 can be located outside reference circuit 141, such as within control circuit 127 or elsewhere within memory 100.)

In one embodiment, for a read of a selected memory cell of array 102 (e.g. cell 111), a bit line read voltage, VBLread is applied to the bit line coupled to the cell being read (e.g. RBL1) with the corresponding source line set to ground, and a word line read voltage, VWLread, is applied to activate the word line coupled to the cell being read (e.g. WL1). This results in read current Icell on the corresponding bit line (e.g. RBL1). Similarly, for the read, the first current electrode of transistor 240 is coupled to ground while VBLread is applied to the second current electrode of transistor 242, VWLread is applied to a control electrode of transistor 240, and OTP prog Vref is applied to the control electrode of transistor 242 (to set the resistance of the variable resistor implemented by transistor 242), which results in Iref output by transistor 242. As illustrated in FIG. 1, for an OTP read operation, the bit lines coupled to selected MRAM cells being read are coupled to the set of K sense amplifiers to provide the corresponding read currents (Icells), in which each sense amplifier also receives a reference (e.g. Iref). Based on these inputs, each sense amplifier provides the corresponding data output (D01-D0K), as was described above. The data outputs correspond to the OTP read value when in OTP mode (e.g. when OTPM is asserted) and a normal read value when not in OTP mode (e.g. when OTPM is negated).

Figure 5:
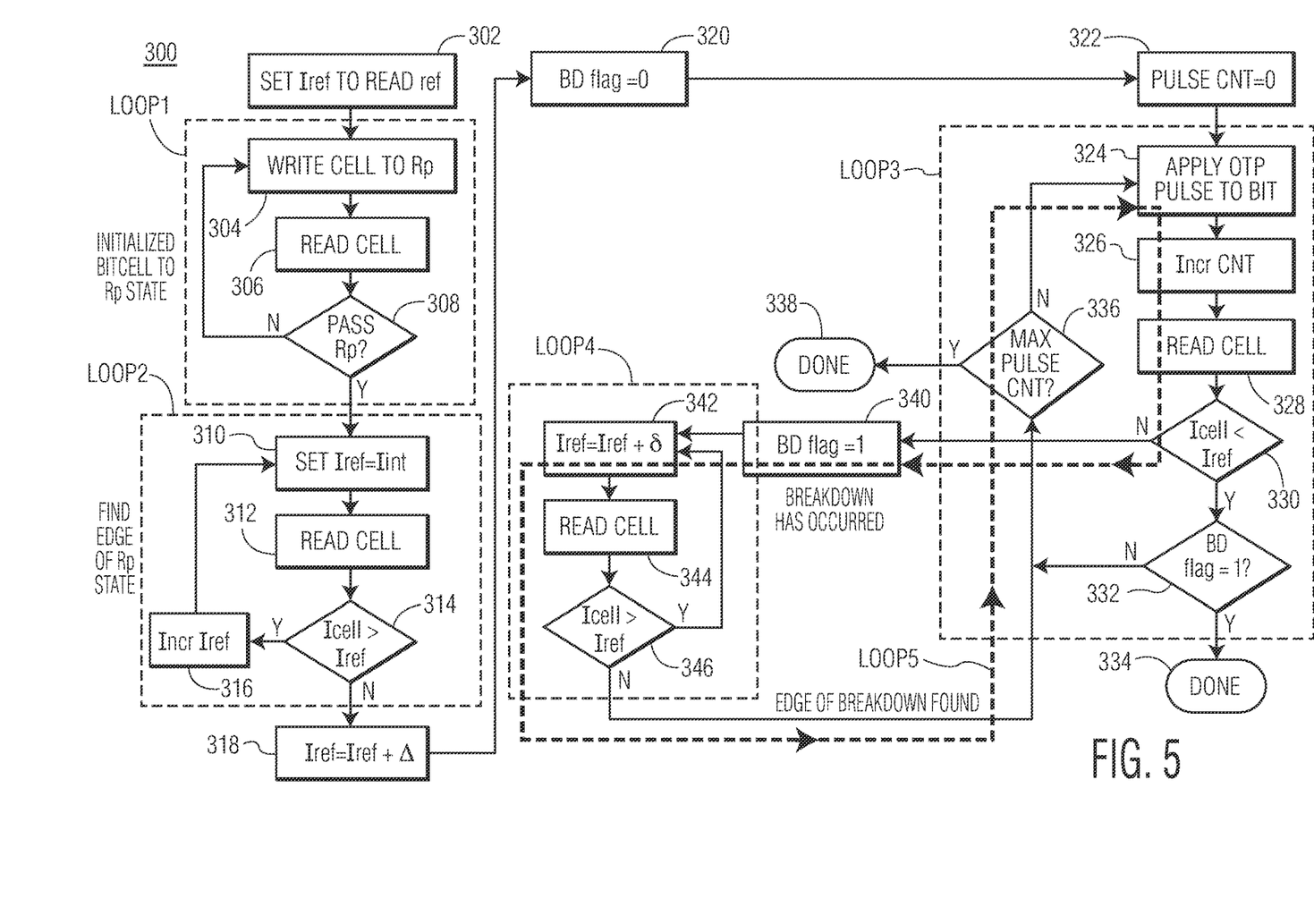
FIG. 5 is a flow diagram for a self-referencing OTP write operation performed in the MRAM of FIG. 1, according to one embodiment of the present invention.

FIG. 5 illustrates, in flow diagram form, a method 300 for performing a self-referencing OTP write in MRAM 100, in accordance with one embodiment of the present invention, in which method 300 can be performed on a per bit cell basis for the OTP bit cells being programmed. Control circuit 127 may include circuitry, such as, e.g., a state machine or other logic circuitry, to control the operation for read and write operations, including the self-referencing OTP write described in FIG. 5. Prior to achieving breakdown, the highest cell current is expected when a bit cell is in the Rp state (i.e. LRS, corresponding to a data "0" state). Therefore, method 300 begins with determining the data "0" cell current level (I"0"), which corresponds to determining the edge of the Rp state, for each (non-blown) OTP bit cell before beginning the two-phase OTP write for the OTP bit cell.

Beginning in block 302 of method 300, Iref is set to the MRAM read reference current, and loop1 of method 300 is performed to first initialize the bit cell to the Rp state. (Note that, for the initialization performed by loop 1 as well as loop 2, the bit cell has not yet been blown and therefore can still be in either the Rp or Rap states.) At block 304, the bit cell is written (i.e. programmed) to the Rp state by applying an MRAM write pulse to the bit cell. Next, at block 306, a verify read is performed, and then, at decision diamond 308 it is determined whether the verify read indicates that the bit cell has been successfully written to the Rp state. For example, a pass (i.e. a successful write) is indicated if the sensed bit cell current is greater than Iref (the MRAM read reference current). If the verify read did not pass, loop1 of method 300 returns to block 304 in which a subsequent MRAM write pulse is applied. Once the bit cell is successfully written to the Rp state (corresponding to arrow 250 of FIG. 3), method 300 exits loop1, proceeding from decision diamond 308 to block 310, which begins loop2 to find the edge of the Rp state.

To find the edge of the Rp state (corresponding to the lowest current/highest resistance of the Rp state distribution), the OTP prog ref is ramped up starting at Vint (e.g. using DAC 244) in which the read current is sensed relative to the OTP reference current at each step. At block 310, Iref is set to Iint (which corresponds to the cell current generated by reference circuit 141 when Vint is provided as the OTP prog ref). With Iint being the lowest value of Iref in the range of Iint to Ifin, Iint corresponds to a highest resistance provided by the variable resistor implemented by transistor 242. Therefore, with the bit cell in the Rp state, Icell is expected to be greater than Iint. Next, at block 312, the bit cell is read (i.e. the read current Icell generated by the bit cell is sensed by the corresponding sense amplifier), and at decision diamond 314, it is determined whether Icell is still greater than Iref. If so, loop2 of method 300 continues to block 316 in which Iref is incremented and returns to block 310. For example, in one embodiment, Iref is incremented by increasing OTP prog Vref. This may be done by stepping up the Vref code with a step size between, for example, 2-5 percent.

Loop2 continues until Icell is no longer greater than Iref. Therefore, at decision diamond 314, when Icell is not greater than Iref, method 300 exits loop2 in which the current value of Iref corresponds to the data "0" cell current I"0" (which may be referred to as the Iref trip point). Note that Iref at the end of loop2 corresponds to dotted line 252 of FIG. 3 which indicates the edge of the Rp state, and will be used in a first phase (phase 1) as the initial OTP program reference to detect onset of breakdown. Method 300, upon exiting loop2, proceeds to block 318 in which a first delta (e.g. A) is added to Iref. That is, at the end of loop 2 (once Icell is no longer greater than Iref at decision diamond 314), Iref is slightly greater than Icell. Therefore, at block 318, the first delta is added to Iref to add a margin for Iref. (That is, the initial OTP program reference can be updated to account for this margin.) In one embodiment, the first delta is in a range of 10 to 30 percent of Iref (of I"0"). This margin may account, for example, for sense amp resolution and to ensure onset of breakdown. The resulting Iref value with the added margin corresponds to dotted line 253 of FIG. 3. The values of the Iref trip point and the first delta can be stored, for example, within control circuit 127, and used when performing the OTP write to the corresponding bit.

Beginning next with block 320, for each selected bit cell of the OTP write, the OTP write begins to determine the onset of breakdown of the tunnel dielectric of the MTJ. At block 320, the BD flag is set to zero, to indicate that breakdown has not yet begun (the onset of breakdown has not yet been detected). At block 322, the pulse count for an OTP write is cleared to zero as well. Next, at block 324, an OTP write pulse (i.e. OTP program pulse) is applied to the bit cell. This begins loop3 in which OTP write pulses are applied until the sensed read current Icell exceeds the updated initial Iref of block 318 (i.e. Iref trip point (I"0")+ the first delta). After block 324, the pulse count is incremented at block 326, and the bit cell is read (i.e. sensed) at block 328 to obtain the read current Icell. At decision diamond 330, if Icell is still less than Iref, loop3 of method 300 proceeds to decision diamond 332 in which the BD flag is checked. If it has not yet been asserted (indicating break down has not yet begun), loop3 of method 300 proceeds to decision diamond 336. At decision diamond 336, if a maximum number of OTP write pulses has been applied, the OTP write is complete at DONE 338. If the maximum number of OTP write pulses has not been reached, loop3 returns to block 324 in which another OTP pulse is applied to the bit cell.

However, at decision diamond 330, when Icell has exceeded Iref (when Icell is no longer less than Iref but is greater than or equal to Iref), loop3 is exited and method 300 proceeds to block 340 in which the BD flag is set to a logic level one to indicate that breakdown has begun (that some level of breakdown has occurred, regardless of the breakdown being in the hard or soft state). Block 340 also begins loop 4 of method 300 in which, after setting the BD flag, method 300 proceeds to block 342 where Iref is updated by adding a second delta (e.g. δ) to Iref. Afterwards, the cell is read again at block 344 and the sensed read current Icell is compared to this updated Iref at decision diamond 346. If Icell is still greater than Iref, loop 4 of method 300 returns back to block 342 in which Iref is incrementally updated by again adding the second delta value. Loop 4 continuously increments Iref until, at decision diamond 346, Icell is no longer greater than Iref. This Iref (at the exit of loop 4) corresponds to the edge of the breakdown state, in which the breakdown state can still be either a soft or hard breakdown state. In one embodiment, each of the incrementally increased Irefs may correspond to soft breakdown states, as illustrated with dotted lines 254, 255, and 256 of FIG. 3.

Once the edge of the breakdown state (for either a soft or hard breakdown) is determined, method 300 proceeds from decision diamond 346 to decision diamond 336. If the maximum number of pulse counts has not been reached, an additional OTP pulse is applied, to ensure a hard breakdown state (corresponding to dotted line 257 of FIG. 3). Assuming, at decision diamond 300, that Icell is still less than Iref (which was last updated at block 342 with the second delta), method 300 proceeds to decision diamond 332 in which, if the BD flag is already set, the OTP write is complete at DONE 334. Therefore, loop5 begins initially (and thus is bounded by) Icell being greater than Iref (corresponding to the "No" path from decision diamond 330) and checks that after an extra OTP write pulse is applied, that Icell is still less than Iref (the updated version of Iref from block 342, with the additional second delta). This indicates the current saturation of the bit cell, in which, due to the hard breakdown of the bit cell, the cell current minimally changes after each additional write pulse (e.g. increases by no more than the second delta). This ensures a stabilized hard breakdown state of the blown bit cell. Therefore, when loop5 is exited through decision diamond 332 to done 334, the bit cell has been blown into the hard breakdown state and has stabilized. (Note that, referring back to decision diamond 330 during execution of loop5, if Icell is not still less then Iref, loop4 is performed again, as described above.)

Note that loop1 and loop2 correspond to initialization of a self-referencing OTP write in which an adaptive OTP program reference current is determined per bit cell by first initializing the bit cell to the Rp state and then finding the reference current trip point at the edge of the Rp state. This reference current trip point, along with a margin, can be stored and subsequently used as the initial OTP program reference (e.g. block 318) for a two-phase OTP write to permanently blow the MTJ of the bit cell. For example, loop3 corresponds to the first phase (phase 1) of the self-referencing OTP write in which the onset of breakdown is first determined (at which point, the BD flag is set to one, and the onset of breakdown can either be a soft or hard breakdown). Loops 4 and 5 correspond to the second phase (phase 2) of the self-referencing OTP write which looks for a hard breakdown to occur (ensures that the bits in the soft breakdown state are additionally programmed to achieve the hard breakdown state), updating the OTP program reference, as needed (e.g. block 342). Furthermore, in phase 2, loop5 (using the updated OTP program reference at the exit of loop 4) ensures that the Icell of the blown cell has stabilized by ensuring that current saturation occurs after hard breakdown.

Note that the initialization through block 318, including loops 1 and 2, can be performed on the MRAM array for each MRAM cell prior to performing OTP writes. Alternatively, the initialization can be performed before each write or at other available times. During initialization, the values of Iref (at the exit of loop 2) and the first delta can be stored separately in the storage circuitry of control circuit 27, or the value of Iref with the margin (the resulting value of Iref in block 318) can be stored in the storage circuitry of control circuit 27. Therefore, upon performing an OTP write, these stored values can be obtained to provide the initial OTP program reference for the MRAM cell being programmed (i.e. written).

Therefore, by now it can be understood how an improved OTP write in an MRAM memory can be achieved by first ensuring, in a first phase, that a breakdown of the MTJ has begun and then ensuring, in a second phase, that the hard breakdown state has been reached. This ensures that blown cells within an MRAM array are permanently and reliably blown, which results in improved OTP device.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The following are some embodiments of the present invention. Note that any of the aspects described below may apply to any of the embodiments described below.

In one embodiment, a magnetoresistive random access memory (MRAM) includes an MRAM array including MRAM cells arranged in rows and columns, each MRAM cell of the MRAM array including a corresponding Magnetic Tunnel Junction (MTJ) which includes a corresponding tunnel dielectric layer, wherein the corresponding MTJ is capable of being in a blown state or non-blown state, in which, in the non-blown state, the corresponding MTJ is capable of being in a high resistive state (HRS) or a low resistive state (LRS), the LRS corresponding to a lower resistance than the HRS, and the blown state corresponding to a permanent breakdown of the corresponding tunnel dielectric layer which results in a lower resistance than the LRS; and write circuitry configured to perform a one-time-programmable (OTP) write operation to blow selected MRAM cells of the MRAM array. The write circuitry is configured to use an initial OTP program reference for the MRAM cell being blown to detect onset of tunnel dielectric breakdown after application of each OTP write pulse of the OTP write operation; and, after detection of the onset, update the initial OTP program reference to obtain an updated OTP program reference, apply at least one additional OTP write pulse to the MRAM cell being blown, and use the updated OTP program reference to verify that current saturation of the MRAM cell being blown has occurred. In one aspect, the initial OTP program reference corresponds to an initial reference current and the updated OTP program reference corresponds to an updated reference current, wherein the write circuitry is configured to, after the application of each OTP write pulse to the MRAM cell being blown, sense a cell current of the MRAM cell being blown as compared to the initial reference current. In a further aspect, the write circuitry is configured to detect the onset of tunnel dielectric breakdown when the sensed cell current is no longer less than the initial reference current. In yet a further aspect, updating the initial OTP program reference comprises incrementally increasing the initial reference current to obtain the updated reference current. In another further aspect, wherein the write circuitry is configured to, after incrementally increasing the initial reference current, again sense the cell current of the MRAM being blown and compare the again sensed cell current with the updated reference current, and apply the at least one additional OTP write pulse when the again sensed cell current is not greater than the updated reference current. In a further aspect, the write circuitry is configured to, after again sensing the cell current of the MRAM being blown, when the again sensed cell current is greater than the updated reference current, incrementally increasing the updated reference current, wherein using the updated OTP program reference to verify the current saturation is performed by using the incrementally increased updated reference current to verify the current saturation. In another aspect, the write circuitry is configured to use the updated OTP program reference to verify that current saturation of the MRAM cell being blown has occurred by, after applying the at least one additional OTP pulse, again sensing the cell current of the MRAM being blown and comparing the again sensed cell current with the updated reference current. In a further aspect, the write circuitry is configured to verify that the current saturation has occurred when the again sensed cell current remains less than the updated reference current. In another aspect, the MRAM further includes a control circuit, wherein the initial OTP program reference for the MRAM cell being blown is obtained using one or more values stored in storage circuitry of the control circuit. In a further aspect, the control circuitry is configured to initialize each non-blown MRAM cell of the MRAM array by directing the write circuitry to program the non-blown MRAM cell to the LRS, setting a read reference current to an initial read reference current, iteratively reading the non-blown cell and incrementally increasing the read reference current until a read current of the non-blown MRAM cell is no longer greater than the read reference current, and, after the iteratively reading and incrementally increasing, storing a final value of the read reference current corresponding to the non-blown MRAM cell in the storage circuitry, wherein the write circuitry is configured to obtain the final value of the read reference current from the storage circuitry for the MRAM cell being blown and set the initial OTP program reference based on the obtained final value of the read reference current. In a further aspect, the MRAM further includes reference circuitry having a reference MRAM cell and configured to receive an OTP reference voltage and generate the read reference current based on the OTP reference voltage. In a further aspect, the MRAM further includes a digital to analog converter (DAC) configured to output the OTP reference voltage to the reference MRAM cell, wherein the read reference current is incrementally increased by adjusting a digital input code to the DAC to incrementally increase the OTP reference voltage.

In another embodiment, a method of performing a one-time-programmable (OTP) write to a magnetoresistive random access memory (MRAM) cell to blow the MRAM cell by causing a permanent breakdown of a Magnetic Tunnel Junction (MTJ) of the MRAM cell includes iteratively applying an OTP write pulse to the MRAM cell until a comparison between a read current of the MRAM cell and an initial OTP program current reference indicate breakdown of the MTJ has occurred; after the breakdown has occurred, iteratively increasing the initial OTP program current reference until the read current of the MRAM cell is no longer greater than the increased initial OTP program current reference; and after the iteratively increasing the initial OTP program current reference, applying at least one additional OTP write pulse. In one aspect of the another embodiment, the method further includes, after the applying the at least one additional OTP write pulse, determining that current saturation of the MRAM cell has been achieved when the read current of the MRAM cell remains less than the iteratively increased initial OTP program current reference. In a further aspect, the breakdown of the MTJ prior to the iteratively increasing the initial OTP program current reference corresponds to a soft breakdown state, and the breakdown of the MTJ after the applying the at least one additional write pulse corresponds to a hard breakdown state. In yet a further aspect, the hard breakdown state is more reliably a permanent breakdown state than the soft breakdown state. In another aspect of the another embodiment, the method further includes, prior to the iteratively applying the OTP write pulse, initializing the MRAM cell prior to breakdown of the MTJ by programming the MRAM cell to a parallel state of the MTJ, after the programming the MRAM cell to the parallel state of the MTJ, determining a read reference current corresponding to an edge of the parallel state; and, after the determining the read reference current corresponding to the edge of the parallel state, determining the initial OTP program current reference based on the read reference current. In another aspect, occurrence of the breakdown of the MTJ is indicated when the read current of the MRAM cell is no longer less than the initial OTP program current reference.

In yet another embodiment, a magnetoresistive random access memory (MRAM) includes an MRAM array including MRAM cells arranged in rows and columns, each MRAM cell of the MRAM array including a corresponding Magnetic Tunnel Junction (MTJ) which includes a corresponding tunnel dielectric layer, wherein the corresponding MTJ is capable of being in a blown state or non-blown state, in which the blown state corresponds to a permanent breakdown of the corresponding tunnel dielectric layer; and write circuitry configured to perform a one-time-programmable (OTP) write operation to blow selected MRAM cells of the MRAM array, wherein, for each MRAM cell being blown. The write circuitry is configured to iteratively apply an OTP write pulse to the MRAM cell until a read current of the MRAM cell being blown is no longer less than an initial OTP program current reference, indicating occurrence of tunnel dielectric breakdown, after the occurrence of tunnel dielectric breakdown is indicated, iteratively increase the initial OTP program current reference until the read current of the MRAM cell is no longer greater than the increased initial OTP program current reference, and, after the iteratively increasing the initial OTP program current reference, applying at least one additional OTP write pulse. In one aspect of the yet another embodiment, the write circuitry is further configured to initialize each non-blown MRAM cell of the MRAM array by programming a corresponding MTJ of the non-blown MRAM cell to a parallel state, iteratively reading the non-blown cell and incrementally increasing the read reference current until a read current of the non-blown MRAM cell is no longer greater than the read reference current, and, after the iteratively reading and incrementally increasing, storing a final value of the read reference current corresponding to the non-blown MRAM cell in the storage circuitry for use during the OTP write operation for determining the initial OTP program current reference.

What is claimed is:

1. A magnetoresistive random access memory (MRAM) comprising:
    an MRAM array including MRAM cells arranged in rows and columns, each MRAM cell of the MRAM array including a corresponding Magnetic Tunnel Junction (MTJ) which includes a corresponding tunnel dielectric layer, wherein the corresponding MTJ is capable of being in a blown state or non-blown state, in which, in the non-blown state, the corresponding MTJ is capable of being in a high resistive state (HRS) or a low resistive state (LRS), the LRS corresponding to a lower resistance than the HRS, and the blown state corresponding to a permanent breakdown of the corresponding tunnel dielectric layer which results in a lower resistance than the LRS;
    write circuitry configured to perform a one-time-programmable (OTP) write operation to blow selected MRAM cells of the MRAM array, wherein, for each MRAM cell being blown, the write circuitry is configured to:
        use an initial OTP program reference for the MRAM cell being blown to detect onset of tunnel dielectric breakdown after application of each OTP write pulse of the OTP write operation; and
        after detection of the onset, update the initial OTP program reference to obtain an updated OTP program reference, apply at least one additional OTP write pulse to the MRAM cell being blown, and use the updated OTP program reference to verify that current saturation of the MRAM cell being blown has occurred.

2. The MRAM of claim 1, wherein the initial OTP program reference corresponds to an initial reference current and the updated OTP program reference corresponds to an updated reference current, wherein the write circuitry is configured to, after the application of each OTP write pulse to the MRAM cell being blown, sense a cell current of the MRAM cell being blown as compared to the initial reference current.

3. The MRAM of claim 2, wherein the write circuitry is configured to detect the onset of tunnel dielectric breakdown when the sensed cell current is no longer less than the initial reference current.

4. The MRAM of claim 3, wherein updating the initial OTP program reference comprises incrementally increasing the initial reference current to obtain the updated reference current.

5. The MRAM of claim 4, wherein the write circuitry is configured to, after incrementally increasing the initial reference current:
    again sense the cell current of the MRAM being blown and compare the again sensed cell current with the updated reference current; and
    apply the at least one additional OTP write pulse when the again sensed cell current is not greater than the updated reference current.

6. The MRAM of claim 5, wherein the write circuitry is configured to, after again sensing the cell current of the MRAM being blown:
    when the again sensed cell current is greater than the updated reference current, incrementally increasing the updated reference current, wherein using the updated OTP program reference to verify the current saturation is performed by using the incrementally increased updated reference current to verify the current saturation.

7. The MRAM of claim 3, wherein the write circuitry is configured to use the updated OTP program reference to verify that current saturation of the MRAM cell being blown has occurred by:
    after applying the at least one additional OTP pulse, again sensing the cell current of the MRAM being blown and comparing the again sensed cell current with the updated reference current.

8. The MRAM of claim 7, wherein the write circuitry is configured to verify that the current saturation has occurred when the again sensed cell current remains less than the updated reference current.

9. The MRAM of claim 1, further comprising a control circuit, wherein the initial OTP program reference for the MRAM cell being blown is obtained using one or more values stored in storage circuitry of the control circuit.

10. The MRAM of claim 9, wherein:
    the control circuitry is configured to initialize each non-blown MRAM cell of the MRAM array by:
        directing the write circuitry to program the non-blown MRAM cell to the LRS;
        setting a read reference current to an initial read reference current;
        iteratively reading the non-blown cell and incrementally increasing the read reference current until a read current of the non-blown MRAM cell is no longer greater than the read reference current; and
        after the iteratively reading and incrementally increasing, storing a final value of the read reference current corresponding to the non-blown MRAM cell in the storage circuitry,
    wherein the write circuitry is configured to obtain the final value of the read reference current from the storage circuitry for the MRAM cell being blown and set the initial OTP program reference based on the obtained final value of the read reference current.

11. The MRAM of claim 10, further comprising reference circuitry having a reference MRAM cell and configured to receive an OTP reference voltage and generate the read reference current based on the OTP reference voltage.

12. The MRAM of claim 11, further comprising:
a digital to analog converter (DAC) configured to output the OTP reference voltage to the reference MRAM cell, wherein the read reference current is incrementally increased by adjusting a digital input code to the DAC to incrementally increase the OTP reference voltage.

13. A method of performing a one-time-programmable (OTP) write to a magnetoresistive random access memory (MRAM) cell to blow the MRAM cell by causing a permanent breakdown of a Magnetic Tunnel Junction (MTJ) of the MRAM cell, the method comprising:
iteratively applying an OTP write pulse to the MRAM cell until a comparison between a read current of the MRAM cell and an initial OTP program current reference indicate breakdown of the MTJ has occurred;
after the breakdown has occurred, iteratively increasing the initial OTP program current reference until the read current of the MRAM cell is no longer greater than the increased initial OTP program current reference; and
after the iteratively increasing the initial OTP program current reference, applying at least one additional OTP write pulse.

14. The method of claim 13, further comprising:
after the applying the at least one additional OTP write pulse, determining that current saturation of the MRAM cell has been achieved when the read current of the MRAM cell remains less than the iteratively increased initial OTP program current reference.

15. The method of claim 14, wherein the breakdown of the MTJ prior to the iteratively increasing the initial OTP program current reference corresponds to a soft breakdown state, and the breakdown of the MTJ after the applying the at least one additional write pulse corresponds to a hard breakdown state.

16. The method of claim 15, wherein the hard breakdown state is more reliably a permanent breakdown state than the soft breakdown state.

17. The method of claim 13, further comprising, prior to the iteratively applying the OTP write pulse:
initializing the MRAM cell prior to breakdown of the MTJ by programming the MRAM cell to a parallel state of the MTJ;
after the programming the MRAM cell to the parallel state of the MTJ, determining a read reference current corresponding to an edge of the parallel state; and
after the determining the read reference current corresponding to the edge of the parallel state, determining the initial OTP program current reference based on the read reference current.

18. The method of claim 13, wherein occurrence of the breakdown of the MTJ is indicated when the read current of the MRAM cell is no longer less than the initial OTP program current reference.

19. A magnetoresistive random access memory (MRAM) comprising:
an MRAM array including MRAM cells arranged in rows and columns, each MRAM cell of the MRAM array including a corresponding Magnetic Tunnel Junction (MTJ) which includes a corresponding tunnel dielectric layer, wherein the corresponding MTJ is capable of being in a blown state or non-blown state, in which the blown state corresponds to a permanent breakdown of the corresponding tunnel dielectric layer;
write circuitry configured to perform a one-time-programmable (OTP) write operation to blow selected MRAM cells of the MRAM array, wherein, for each MRAM cell being blown, the write circuitry is configured to:
iteratively apply an OTP write pulse to the MRAM cell until a read current of the MRAM cell being blown is no longer less than an initial OTP program current reference, indicating occurrence of tunnel dielectric breakdown,
after the occurrence of tunnel dielectric breakdown is indicated, iteratively increase the initial OTP program current reference until the read current of the MRAM cell is no longer greater than the increased initial OTP program current reference, and
after the iteratively increasing the initial OTP program current reference, applying at least one additional OTP write pulse.

20. The MRAM of claim 19, wherein the write circuitry is further configured to initialize each non-blown MRAM cell of the MRAM array by:
programming a corresponding MTJ of the non-blown MRAM cell to a parallel state,
iteratively reading the non-blown cell and incrementally increasing the read reference current until a read current of the non-blown MRAM cell is no longer greater than the read reference current, and
after the iteratively reading and incrementally increasing, storing a final value of the read reference current corresponding to the non-blown MRAM cell in the storage circuitry for use during the OTP write operation for determining the initial OTP program current reference.

* * * * *